United States Patent [19]
Yeh et al.

[11] Patent Number: 5,770,508
[45] Date of Patent: Jun. 23, 1998

[54] METHOD OF FORMING LIGHTLY DOPED DRAINS IN METALIC OXIDE SEMICONDUCTOR COMPONENTS

[75] Inventors: Wen-Kuan Yeh, Chupei; Coming Chen, Taoyuan Hsien; Jih-Wen Chou, Hsinchu, all of Taiwan

[73] Assignee: United Microelectronics Corp., Hsinchu, Japan

[21] Appl. No.: 868,816

[22] Filed: Jun. 4, 1997

[30]    Foreign Application Priority Data

Mar. 17, 1997  [TW]   Taiwan ................................. 86103275

[51] Int. Cl.$^6$ .............................................. H01L 21/336
[52] U.S. Cl. ......................................... 438/305; 438/307
[58] Field of Search ................................... 438/305, 306, 438/307, 301, 303, 299, 174, 182, 185, 188, 199, 204

[56]              References Cited

U.S. PATENT DOCUMENTS 4,784,965  11/1988  Woo et al. ............................... 438/303
4,855,247   8/1989  Ma et al. ................................. 438/305
5,024,959   6/1991  Pfiester .................................... 438/305
5,153,145  10/1992  Lee et al. ................................ 438/305
5,234,850   8/1993  Liao ........................................ 438/305
5,472,896  12/1995  Chen et al. ............................. 438/305

Primary Examiner—Michael Trinh
Attorney, Agent, or Firm—Finnegan, Henderson, Farabow, Garrett & Dunner, L.L.P.

[57]              ABSTRACT

The present invention relates to a method of forming lightly doped drains in metallic oxide semiconductor (MOS) components. The method includes forming a first, second, and third insulating layer above a silicon substrate having a gate, etching back the layers to leave behind L-shaped first spacers on sidewalls of the gate, followed by doping second type ions into the silicon substrate to form first lightly doped drains in the silicon substrate surface below the L-shaped first spacers, and second lightly doped drains in the silicon substrate surface elsewhere, further forming a fourth insulating to form third spacers, and using the using the third spacers, the first insulating layer, and the gate as masks when doping second type ions into the silicon substrate so as to form source/drain regions in silicon substrate surfaces not covered by the third spacers. Such a method produces greater yield and reduces leakage current from the transistor components.

18 Claims, 4 Drawing Sheets

5,770,508

METHOD OF FORMING LIGHTLY DOPED DRAINS IN METALIC OXIDE SEMICONDUCTOR COMPONENTS

BACKGROUND OF THE INVENTION

1. Field of the Invention

The present invention relates in general to a method of manufacturing metal oxide semiconductor (MOS) components, and more particularly to a method of forming lightly doped drains (LDDs) in MOS components.

2. Description of Related Art

Recent advances in semiconductor manufacturing technology have spurred the fabrication of larger wafers having smaller line widths in MOS component designs. With such wafers, more powerful functions and lower production costs can be realized for integrated circuits having the same size. However, lurking behind these developments are some difficult manufacturing problems that still need to be overcome. For example, due to the continued reduction in line width, the channel length of an MOS is correspondingly reduced, which has lead to more serious short channel effects.

When short channel effects do occur, depletion regions generated in the source/drain terminals of an MOS component affect the connectivity between the regions and the channel, thereby raising the original subthreshold current flowing in the channel to a higher level because of the extra electrons passing through. Consequently, regardless of whether a controlling voltage is applied to the gate terminal of an MOS component or not, the MOS component is probably already in an ON or an OFF state, and hence the gate terminal will lose its original intended function as an ON/OFF controlling switch for the MOS component.

Hot electron effects is another dominant phenomenon that affects the operation of an MOS transistor as the channel length is reduced. When the magnitude of the voltage applied to an MOS component remains unchanged, horizontal electric fields existing within the channel will increase, and some hot electrons will be generated having an energy level even higher than the thermal equilibrium state. Through the actions of these hot electrons substrate current will be formed. Such substrate current will affect the state of connectivity of a normal MOS channel and may ultimately lead to an all out electrical breakdown of the transistor.

One effective method for containing the short channel effects is to add a lightly doped region in part of the source/drain region bordering the channel. This type of design is known as lightly doped drain or LDD for short.

FIG. 1A through 1D are cross-sectional views showing a conventional method of forming LDDs.

Referring to FIG. 1A, a semiconductor substrate 10 with first type ions doped inside, such a boron doped P-type silicon substrate, including a field oxide layer 12 and a gate 14 formed on a top surface thereof Thereafter, second type ions, such as arsenic or phosphorus ions having an ion concentration of about $10^{13}$ atoms/cm are implanted into the semiconductor substrate 10 to define lightly doped drains 16.

Referring next to FIG. 1B, a silicon dioxide layer 18 is then formed over the semiconductor substrate 10, for example, using a chemical vapor deposition (CVD) method. Then, at a temperature of between about 900° C. to 1000° C., second type ions 11 are diffused, while at the same time part of the semiconductor substrate 10 structure which may have been damaged through the ion implantation process is restored through annealing.

Referring next to FIG. 1C, an anisotropic etching method is then used to etch out spacers. A large portion of the silicon dioxide layer 18 formed above the semiconductor substrate 10 is removed by a dry etching method using the thickness of the silicon dioxide layer as a reference. Since the thickness of the silicon dioxide layer 18 attached to the sidewalls 19 of the gate 14 is higher than at other places, a portion of the original silicon dioxide layer 18 will remain attached to the sidewalls of the gate 14 after the dry etching operation, thereby forming silicon spacers 18a.

Lastly, referring to FIG. 1D, using the field oxide layer 12, the gate 14 and the sidewall spacers 18a as masks, a heavy doping is performed to create the structure having lightly doped drain regions 16 next to the source/drain regions 17 in the semiconductor substrate 10. This step may be carried out, for example, by doping second type ions 13 having a concentration of about $10^{15}$ atoms/cm.

However, for the above manufacturing method, certain problems are bound to arise when the smallest line width used for the MOS components is further reduced to say 0.25 atoms/cm or lower. Normally, after the formation of the lightly doped drains, a metallic layer, such as titanium will be deposited above the gate and source/drain terminals to increase their electrical conductivity by a self-aligned silicidation operation. When the level of integration for transistor components is increased, the self-aligned Ti-Silicide layer formed above a source/drain terminal may penetrate through the junction between an LDD and a source/drain terminal, thereby making direct contact with the semiconductor substrate, thus lowering the transistor component yield of the manufacturing operation.

In a closely related problem, when the level of integration is increased punch-through margins formed around the source/drain regions after ionic doping locate closer to each other. This closeness results in a large leakage current from the transistor components.

SUMMARY OF THE INVENTION

The objects of the invention are to provide a lightly doped drain having a graded doping profile on two sides of the gate terminal so as to move the punch-through margins formed around the source/drain regions further apart while maintaining integrity at the junction between an LDD and a source/drain region even after the formation of a self-aligned Ti-Silicide layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method of forming lightly doped drains in MOS components comprising: providing a silicon substrate doped with first type ions, a first insulating layer, and a gate, forming a second insulating layer and a third insulating layer above the silicon substrate, etching back the third and the second insulating layers so as to completely remove the second insulating layer above the gate while leaving behind L-shaped first spacers and second spacers on sidewalls of the gate, removing the second spacers, followed by doping second type ions into the silicon substrate to form first lightly doped drains in the silicon substrate surface below the L-shaped first spacers, and second lightly doped drains in the silicon substrate surface elsewhere, forming a fourth insulating layer above the silicon substrate, followed by etching back the fourth insulating layer so as to form third spacers, and using the third spacers, the first insulating layer, and the gate as masks when doping second type ions into the silicon substrate so as to form source/drain regions in silicon substrate surfaces not covered by the third spacers.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principals of the invention. In the drawings.

DESCRIPTION OF THE PREFERRED EMBODIMENTS

Reference will now be made in detail to the present preferred embodiment of the invention, an example of which is illustrated in the accompanying drawings. Wherever possible, the same reference numbers will be used throughout the drawings to refer to the same or like parts.

Figure 1A:
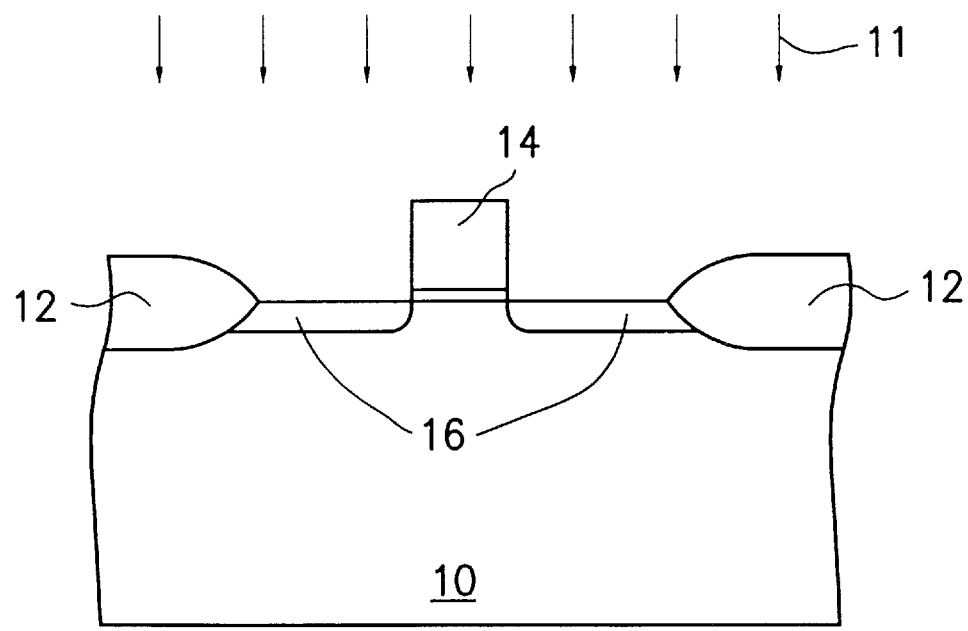
FIGS. 1A through 1D are cross-sectional views showing a conventional method of forming lightly doped drains in MOS components.
Figure 1B:
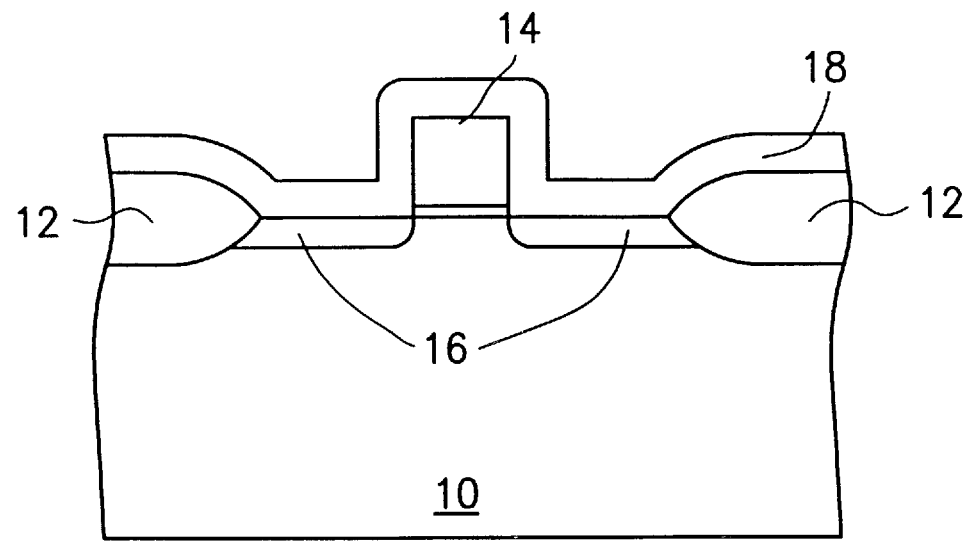
Figure 1C:
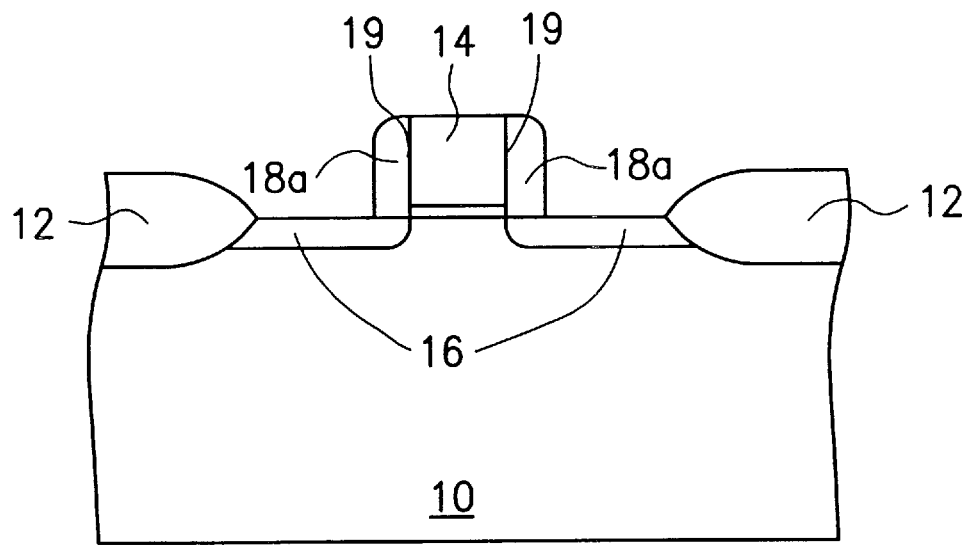
Figure 1D:
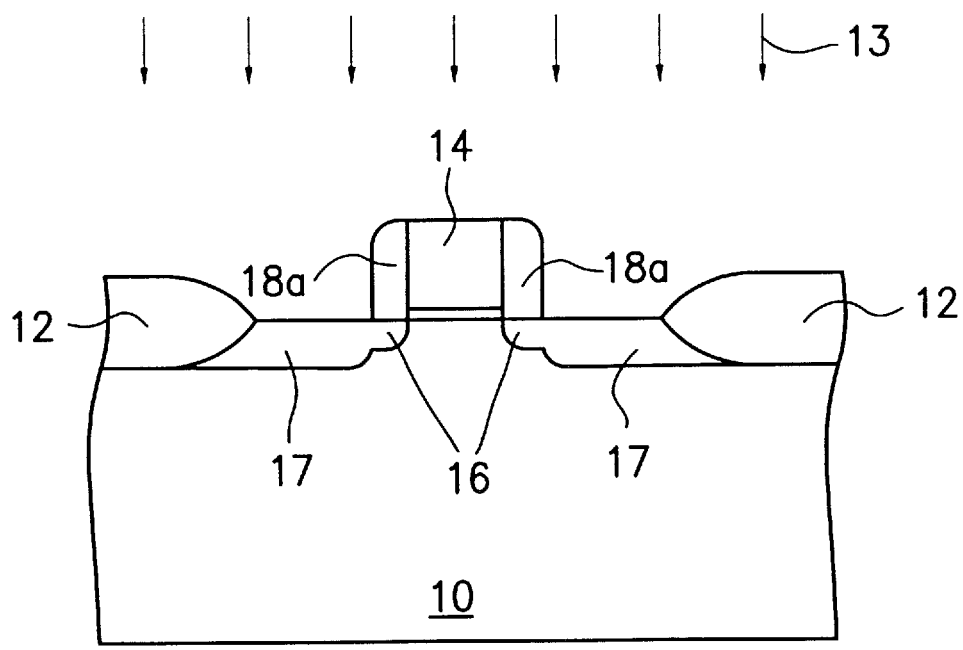
Figure 2A:
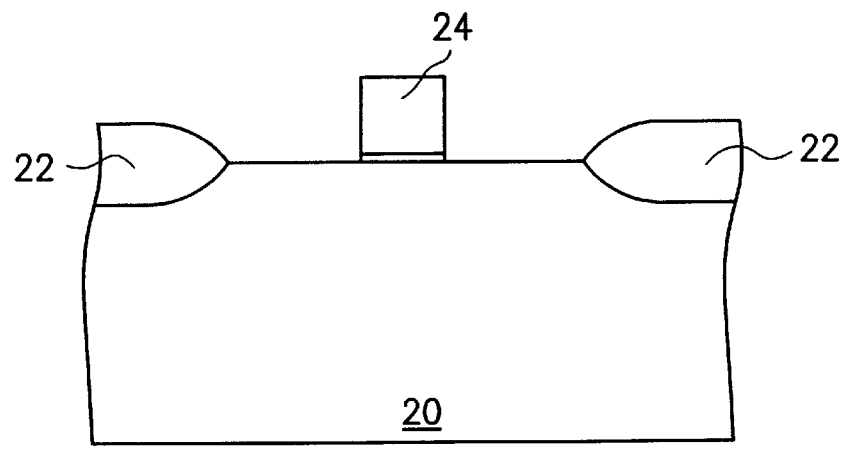
FIGS. 2A through 2F are cross-sectional views showing a method of forming lightly doped drains in MOS components according to the preferred embodiment of this invention.

Referring to FIG. 2A, a first type ion doped semiconductor substrate 20, such as a boron doped P-type silicon substrate, includes a first insulating layer 22, such as a field oxide layer or a shallow trench isolation (STI), and a gate 24 provided on a top surface thereof.

Figure 2B:
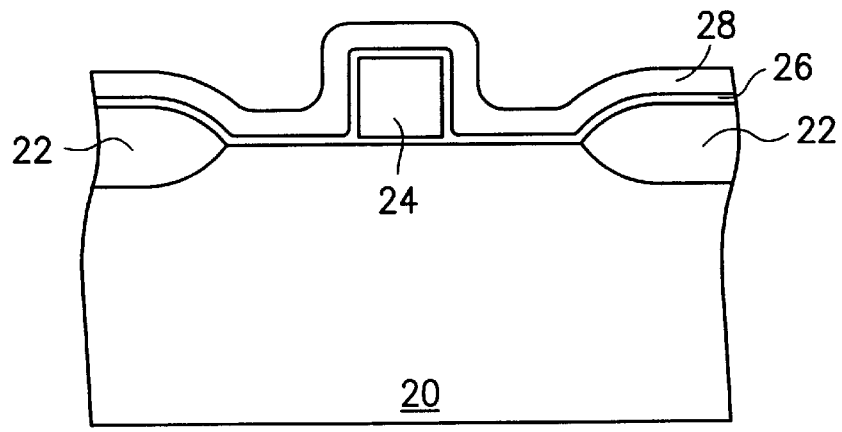

Referring next to FIG. 2B, a second insulating layer 26 and a third insulating layer 28 are sequentially formed above the semiconductor substrate 20. The second insulating layer 26 can be, for example, a silicon dioxide layer having a thickness of between about 100 Å to 200 Å, while the third insulating layer 28, for example, can be silicon nitride layer having a thickness of between about 1500 Å to 2000 Å.

Figure 2C:
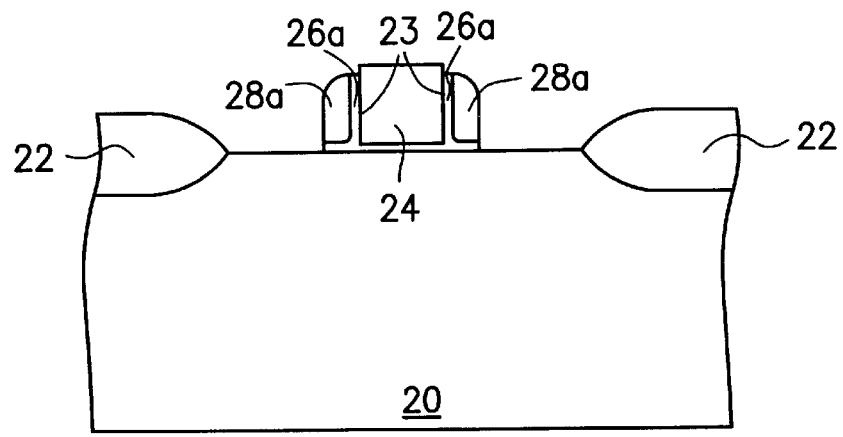

Referring next to FIG. 2C, the third insulating layer 28 and the second insulating layer 26 are then etched back using an anisotropic reactive ion etching method to form L-shaped first spacers 26a and second spacers 28a on the sidewalls 23 of the gate 24.

Figure 2D:
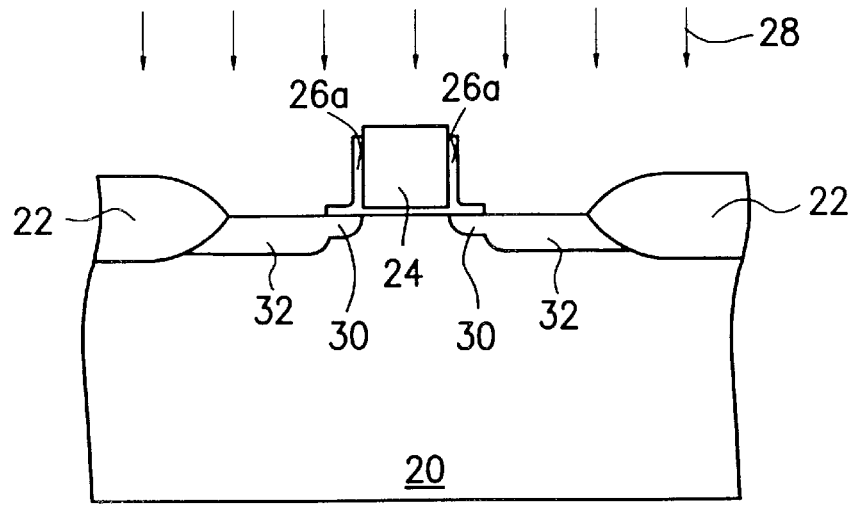

Thereafter, referring to FIG. 2D, the second spacers 28a are removed, for example, by wet etching the second spacers 28a with hot phosphoric acid (H3PO4) solution, thereby leaving behind only the first spacers 26a. Next, second type ions 28 are implanted into the semiconductor substrate 20, for example, by doping pentavalent arsenic ions having energy of between about 10 to 200 KeV. Because of the L-shaped spacers 26a, two LDD layers (30, 32) having different depth levels are formed next to each other inside the semiconductor substrate 20. The shallower regions, or first LDD 30, located beneath the first spacers 26a are called shallow source/drain extension regions, while the regions not covered by the first spacers 26a, or second LDD 32, are known as moderate source/drain extension regions.

Figure 2E:
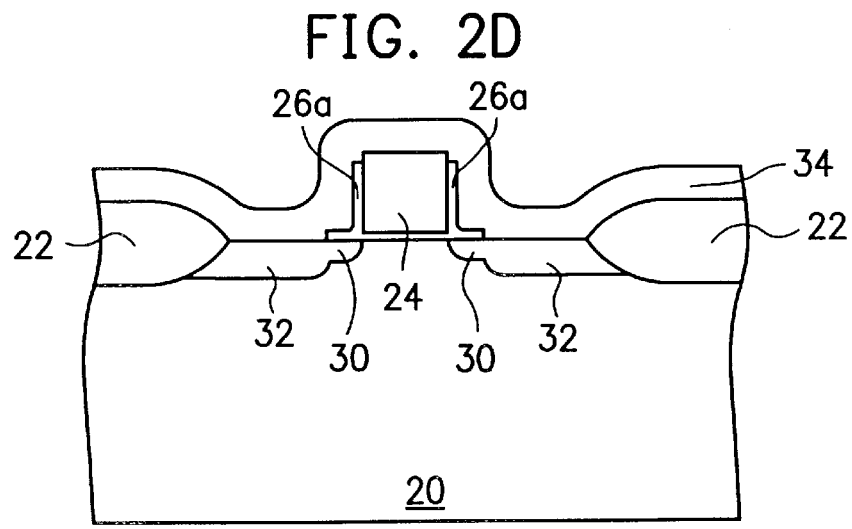

Subsequently, referring to FIG. 2E, a fourth insulating layer 34 is formed so as to cover the semiconductor substrate 20. The fourth insulating layer 34 can be, for example, a silicon dioxide layer having a thickness of between about 1500 Å to 2500 Å, or a silicon nitride layer having a thickness of between about 2000 Å to 2500 Å.

Figure 2F:
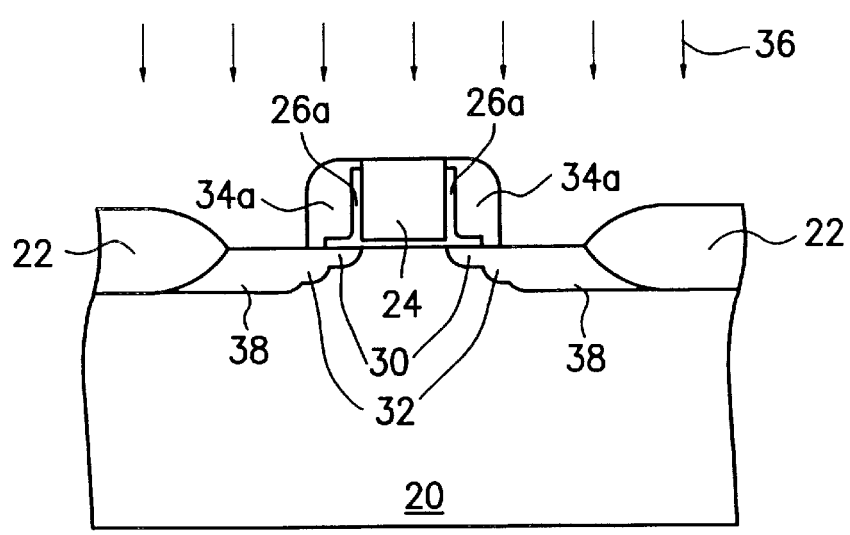

Finally, referring to FIG. 2F, the fourth insulating layer 34 is the etched back using a dry etching method to form third spacers 34a enclosing the L-shaped first spacers 26a. Thereafter, using the third spacers 34a, the first insulating layer 22 and the gate 24 as masks, another heavy doping of second type ions 36 is performed to form source/drain regions 38 known as a deep source/drain extension region.

MOS components with the lightly doped drains formed according to this invention have several advantages, namely:

1. Through adjusting the deposition thickness of the second insulating layer 26, thickness of the L-shaped first spacers 26a can be adjusted, and when combined with the capacity of tuning the ion implantation energy, depth of ion implantation for the shallow source/drain extension regions 30 can be easily controlled.
2. The extent of the L-shaped first spacers 26a that remain above the semiconductor substrate 20 can also be adjusted through the deposition of the second insulating layer 26, and when combined with the capacity of tuning the ion implantation energy, the extent of the shallow source/drain extension regions 30 can be easily controlled.
3. Because of the L-shaped first spacer, only one ion implantation operation is necessary to form the two adjacent layers of LDD having different doping depth levels.
4. Through proper adjustments of the depth levels and extents of the first LDD 30 and the second LDD 32, integrity at the LDD and source/drain junction can be maintained after the self-aligned silicide processing operations, thus increasing the yield of the components.
5. Through controlling the deposition thickness of the fourth insulating layer, the extent of the third spacers can also be controlled to locate the source/drain punch-through regions further apart from each other and hence prevent the detrimental current leakage from the LDD which occurs according to the conventional manufacturing process.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming lightly doped drains in MOS components comprising:

providing a silicon substrate doped with first type ions, a first insulating layer, and a gate;

forming a second insulating layer and a third insulating layer above the silicon substrate;

etching back the third and the second insulating layers so as to completely remove the second insulating layer above the gate while leaving behind L-shaped first spacers and second spacers on sidewalls of the gate;

removing the second spacers, followed by doping second type ions into the silicon substrate to form first lightly doped drains in the silicon substrate surface below the L-shaped first spacers, and second lightly doped drains in the silicon substrate surface elsewhere;

forming a fourth insulating layer above the silicon substrate, followed by etching back the fourth insulating layer so as to form third spacers; and using the third spacers, the first insulating layer, and the gate as masks when doping second type ions into the silicon substrate so as to form source/drain regions in silicon substrate surfaces not covered by the third spacers.

2. A method of forming according to claim 1, wherein the first type ions are boron ions.

3. A method of forming according to claim 1, wherein the first insulating layer is a field oxide layer.

4. A method of forming according to claim 1, wherein the first insulating layer is a shallow trench isolation.

5. A method of forming according to claim 1, wherein the second insulating layer is a silicon dioxide layer.

6. A method of forming according to claim 1, wherein the thickness of the second insulating layer is between about 100 Å to 200 Å.

7. A method of forming according to claim 1, wherein the third insulating layer is a silicon nitride layer.

8. A method of forming according to claim 1, wherein the thickness of the third insulating layer is between about 1500 Å to 2000 Å.

9. A method of forming according to claim 1, wherein the second type ions are arsenic ions.

10. A method of forming according to claim 1, wherein the doping energy for the second type ions is between about 10 to 200 KeV.

11. A method of forming according to claim 1, wherein the etching back to process is performed using an anisotropic reactive ion etching method.

12. A method of forming according to claim 1, wherein the second spacers are removed by a wet etching method using hot phosphoric acid solution.

13. A method of forming according to claim 1, wherein the first lightly doped drain is a shallow source/drain extension region.

14. A method of forming according to claim 1, wherein the second lightly doped drain is a moderate source/drain extension region.

15. A method of forming according to claim 1, wherein the fourth insulating layer is a silicon dioxide layer.

16. A method of forming according to claim 15, wherein the thickness of the silicon dioxide layer is between about 1500 Å to 2500 Å.

17. A method of forming according to claim 1, wherein the fourth insulating layer is a silicon nitride layer.

18. A method of forming according to claim 17, wherein the thickness of the silicon nitride layer is between about 2000 Å to 2500 Å.

* * * * *